(12) United States Patent
Ishigaki

(10) Patent No.: US 6,369,601 B1
(45) Date of Patent: Apr. 9, 2002

(54) METHOD OF MEASURING A PROPAGATION DELAY TIME THROUGH A TRANSMISSION PATH IN A SEMICONDUCTOR INTEGRATED CIRCUIT TESTING APPARATUS AND SEMICONDUCTOR INTEGRATED CIRCUIT TESTING APPARATUS USING THE SAME

(75) Inventor: Yukio Ishigaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/413,768

(22) Filed: Oct. 7, 1999

(30) Foreign Application Priority Data

Oct. 8, 1998 (JP) .......................................... 10-286339

(51) Int. Cl.⁷ ............................................ G01R 31/28
(52) U.S. Cl. ...................... 324/765; 324/617; 324/158.1
(58) Field of Search ................................ 324/765, 763, 324/158.1, 73.1, 76.54, 617, 601; 714/736, 733, 700, 724

(56) References Cited

U.S. PATENT DOCUMENTS 4,092,589 A * 5/1978 Chau et al. .................. 714/736
4,771,428 A * 9/1988 Acuff et al. ................. 714/736
5,266,894 A * 11/1993 Takagi et al. ................ 324/765
5,703,489 A * 12/1997 Kuroe ....................... 324/76.54
5,867,030 A   2/1999 Sato

* cited by examiner

Primary Examiner—Vinh P. Nguyen
(74) Attorney, Agent, or Firm—David N. Lathrop, Esq.; Gallagher & Lathrop

(57) ABSTRACT

A propagation delay time measuring method is provided that is capable of easily and accurately measuring propagation delay times Tb and Tc of a drive signal path BL1 connected between a driver DR1 and an I/O pin of an IC under test 119 and a response signal path BL2 connected between a comparator CP2 and the I/O pin of the IC under test, respectively, in a short time, wherein the drive signal path and the response signal path are formed to have the same length, a pulse is supplied to the drive signal path from the driver, and a timing when the pulse is outputted from the response signal path is detected, thereby to measure a total propagation delay time given to the pulse when the pulse has propagated through the drive signal path and the response signal path based on the detected timing, and a time duration equal to 1/2 of the measured propagation delay time is calculated and determined to be a propagation delay time of each of the drive signal path and the response signal path.

19 Claims, 8 Drawing Sheets

METHOD OF MEASURING A PROPAGATION DELAY TIME THROUGH A TRANSMISSION PATH IN A SEMICONDUCTOR INTEGRATED CIRCUIT TESTING APPARATUS AND SEMICONDUCTOR INTEGRATED CIRCUIT TESTING APPARATUS USING THE SAME

BACKGROUND OF THE INVENTION

1. Field of the Invention

The present invention relates to a method of measuring a propagation delay time of a transmission path to be connected to a semiconductor integrated circuit under test in a semiconductor integrated circuit testing apparatus and to a semiconductor integrated circuit testing apparatus using this method. More particularly, the present invention relates to a propagation delay time measuring method which is capable of measuring, in a short time duration and with high accuracy, a propagation delay time of a transmission path or line for a test pattern signal and a propagation delay time of a transmission path or line for a response signal, both the transmission paths being connected to a semiconductor integrated circuit which operates at high speed or rate and has its input terminal and its output terminal used in common, and relates to a semiconductor integrated circuit testing apparatus which is capable of accurately testing a semiconductor integrated circuit of this type using the aforesaid method.

2. Description of the Related Art

As is well known, in this technical field, a semiconductor integrated circuit (hereinafter referred to as IC) is called a logic IC in which a logical circuit portion (logic portion) is dominant or a memory IC in which a memory portion is dominant. In addition, an IC in which a logic portion and a memory portion are present in mixture on one chip is called a systematic LSI (Systematic Large Scale Integrated Circuit) or the like. FIG. 3 shows a general configuration of a semiconductor integrated circuit testing apparatus (hereinafter referred to as IC testing apparatus) which has conventionally been used for testing and measuring these ICs. This IC testing apparatus TES comprises, roughly speaking, a main controller 111, a pattern generator 112, a timing generator 113, a waveform formatter 114, a logical comparator 11 5, a group of drivers (hereinafter referred to as a driver group) 116, a group of analog level comparators (hereinafter referred to as a comparator group) 117, a failure analysis memory 118, a failure relief processor 118A, a response time measuring device 120, a logical amplitude reference voltage source 121, a comparison reference voltage source 122, and a device power supply 123.

The main controller 111 is generally constituted by a computer system, has a test program PM created by a user (programmer) and previously stored therein, and controls the entire IC testing apparatus in accordance with the test program PM. The main controller 111 is connected, via a tester bus BUS, to the pattern generator 112, the timing generator 113, the failure analysis memory 118, the failure relief processor 118A, the response time measuring device 120, the logical amplitude reference voltage source 121, the comparison reference voltage source 122, the device power supply 123, and the like.

An IC to be tested (IC under test: DUT) 119 is mounted on a test head (not shown) constructed separately from the IC testing apparatus proper. Usually, on the top portion of the test head is mounted a member called a "performance board", and a predetermined number of IC sockets are mounted on the performance board. Consequently, the IC under test 119 is mounted on an associated one of these IC sockets. In addition, a printed board called "pin card" in this technical field is accommodated in the test head. Usually, circuits including a driver from the driver group 116 and a comparator from the comparator group 117 of the IC testing apparatus TES are formed on this pin card. In general, the test head is mounted on a test section of an IC transporting and handling apparatus called "handler" in this technical field, and is electrically connected to the IC testing apparatus proper by signal transmission means such as a cable, an optical fiber or the like.

Further, the pin cards on which circuits including the driver from driver group 116 and the comparator from comparator group 117 of the IC testing apparatus TES and the like are formed is also called "pin electronics part" in this technical field. This pin electronics part is comprised of many pin electronics circuits one being provided for one of the terminal pins of the IC under test 119.

First of all, before starting the test of an IC, various kinds of data are set from the main controller 111. After the various kinds of data have been set, the test of the IC is started. When the main controller 111 issues a test start instruction to the pattern generator 112, the pattern generator 112 starts to generate a pattern. Accordingly, the time point when the pattern generator 112 starts to generate the pattern is the start time point of the test. The pattern generator 112 supplies test pattern data to the waveform formatter 114 in accordance with the test program. On the other hand, the timing generator 113 generates a timing signal (clock pulse) for controlling operating timings of the waveform formatter 114, the logical comparator 115, and the like.

The waveform formatter 114 converts the test pattern data supplied from the pattern generator 112 into a test pattern signal having a real waveform. This test pattern signal is applied to the IC under test (generally called "DUT") 119 via the driver group 116 which voltage-amplifies the test pattern signal to a waveform having an amplitude value set by the logical amplitude reference voltage source 121. It is to be noted here that in case the IC under test 119 is a memory IC or a memory portion of a systematic LSI is tested or the like, the test pattern signal is stored in a predetermined memory cell of the IC under test 119 and the stored content is read out therefrom in a read cycle performed later. On the contrary, in case the IC under test is a logic IC or a logic portion of a systematic LSI is tested or the like, the result of a logical operation of the test pattern signal is read out from the IC under test 119 as a response signal.

A response signal read out from the IC under test 119 is compared with a reference voltage supplied from the comparison reference voltage source 122 in the comparator group 117 which in turn determines whether or not the response signal has a predetermined logical level, that is, whether or not the response signal has a logical H (logical high) voltage or a logical L (logical low) voltage. A response signal determined to have the predetermined logical level is sent to the logical comparator 115 where the response signal is compared with an expected value pattern signal outputted from the pattern generator 112 so that whether the IC under test 119 has outputted a normal response signal or not can be determined.

In case the IC under test 119 is a memory IC or a memory portion of a systematic LSI is tested or the like, if the response signal does not coincide with the expected value pattern signal, a decision is rendered that a memory cell having an address of the IC under test 119 from which that response signal has been read out is defective (failure), and a failure signal indicating that fact is generated from the logical comparator 115. Usually, when a failure signal is generated, a failure data (generally logical "1" signal) being applied to a data input terminal of the failure analysis memory 118 is enabled to be written in the memory, and the failure data is stored in an address of the failure analysis memory 118 specified by an address signal supplied to the failure analysis memory 118 at that time. Generally, since an address signal that is the same as the address signal applied to the IC under test 119 is applied to the failure analysis memory 118, the failure data is stored in an address of the failure analysis memory 118 that is the same as the address of the IC under test 119.

On the contrary, when the response signal coincides with the expected value pattern signal, a memory cell of the address of the IC under test 119 from which the response signal has been read out is determined to be normal (not defective), and a pass signal indicating that fact is generated. Usually, this pass signal is not stored in the failure analysis memory 118.

After the test has been completed, the failure data stored in the failure analysis memory 118 are read out therefrom into the failure relief processor 118A in which it is determined, for example, whether the relief of a failure memory cell or cells of the tested IC 119 is possible or not.

On the other hand, in case the IC under test 119 is a logic IC or a logic portion of a systematic LSI is tested or the like, if the response signal does not coincide with the expected value pattern signal, the test pattern signal from which that response signal has resulted, the address at which that test pattern signal has been generated, the logical data outputted from the pin of the IC under test 119 from which that response signal has been outputted, the expected value pattern data at that time, and the like are stored in the failure analysis memory 118. After the test has been completed, these stored data are utilized in an analysis of the cause of the failure occurring mechanism, an evaluation of the LSI, and the like.

The response time measuring device 120 is provided to measure a time interval from a timing that a read command or a response command is given to the IC under test 119 to a timing that the IC under test 119 actually outputs a response signal. Accordingly, the response time measuring device 120 can measure a response rate or speed of the IC under test 119.

The operation for detecting the timing when the IC under test 119 has outputted a response signal is performed in the comparator group 117. Specifically explaining, the timing when a response signal has been outputted is detected by applying a strobe pulse to each level comparator (hereinafter referred to as comparator) in the comparator group 117 and detecting whether the logical state of an output terminal (which also serves as an input terminal in the drawing) of the IC under test 119 is inverted or not at the timing when the strobe pulse has been applied.

For this reason, in case of measuring a response time of the IC under test 119, a plurality of test cycles are performed to measure the response time. That is, each time the IC under test 119 is set to a read cycle, the timing of application of a strobe pulse to the comparator group 117 is shifted by a predetermined phase in regular sequence in the direction of, for example, lagging in phase from the initial phase position of a test cycle constituting the reference test cycle, thereby to detect when the logical state of an output terminal of the IC under test 119 is inverted from logical L to logical H state or from logical H to logical L state. The time duration between the phase position of the strobe pulse having been applied at the time point when the logical state has been inverted and the initial phase position is detected as the response time.

Further, it is illustrated in FIG. 3 such that a test pattern signal outputted from the driver group 116 is applied only to one terminal 119A which serves as an input terminal and also as an output terminal of the IC under test 119, and a response signal from the one input/output terminal 119A of the IC under test 119 is supplied to the comparator group 117. However, in reality, the number of drivers provided in the driver group 116 is equal to the number of input/output terminals, for example 512, of the IC under test 119. Similarly, the number of comparators provided in the comparator group 117 is equal to the number of drivers (for example, 512).

From the above description, the outline of the operation of the IC testing apparatus TES would be understood. In recent years, a for ICs operating at higher speed has increased, and many high-speed ICs have been provided. As a result, the IC testing apparatus TES has been also required to operate at higher speed.

Here, problems occurring in case of testing high-speed ICs will be discussed. First, one problem occurs in the IC driving method for applying a test pattern signal to the IC under test 119 from the driver group 116. This problem occurs where a terminal of the IC under test 119 serves as an input terminal as well as an output terminal as shown in FIG. 3. Hereinafter, the terminal serving as an input terminal as well as an output terminal is referred to as an I/O pin.

The reason thereof will be explained with reference to FIG. 4. FIG. 4 shows a pin electronics circuit for one I/O pin of the IC under test 119, and the pin electronics circuit includes one driver DR and one comparator CP. An input terminal of the comparator CP is connected to an output terminal of the driver DR, and the common connection point P is connected to the I/O pin 119A of the IC under test 119 through a cable BL. Accordingly, the pin electronics circuit is constructed such that an operation for applying a test pattern signal to the I/O pin 119A of the IC under test 119 and an operation for taking a response signal from the I/O pin 119A of the IC under test 119 into the comparator CP are performed through the one cable BL. Further, in FIG. 4, a reference character VT indicates a termination voltage. This termination voltage VT is set to the median value of the amplitude of a test pattern signal outputted from the driver DR.

In the above circuit configuration, if a propagation delay time Tpd of the test pattern signal propagating through the cable BL is assumed to be Ta (Tpd=Ta), in the read cycle, a response signal D0 is delayed by the propagation delay time Ta of the cable BL as shown in FIG. 5B, and is then supplied to the input terminal of the comparator CP. Further, in FIG. 5, a reference character T denotes a test cycle, W denotes a write cycle, and R denotes a read cycle.

In order to supply the test pattern signal PAT to the I/O pin 119A from the beginning of the write cycle W, as shown in FIG. 5D, the test pattern signal PAT must be outputted from the driver DR at the time point preceding the starting time point of the write cycle W by the time duration equal to the propagation delay time Ta.

When the test pattern signal PAT is outputted from the driver DR at the time point preceding by a time duration equal to the propagation delay time Ta, the test pattern signal PAT is immediately supplied to the input terminal of the comparator CP. As a result, the comparator CP cannot acquire a response signal D0 from the IC under test 119 immediately after the driver DR has outputted the test pattern signal PAT. The time duration when the comparator CP cannot acquire a response signal D0 from the IC under test 119 is generally called a dead time DT. As is apparent from FIGS. 5B and 5D, the dead time DT in this case continues from the starting time point of application of the test pattern signal PAT until the ending time point of the response signal D0, and hence the dead time DT becomes twice the propagation delay time Ta of the cable BL.

The comparator CP determines the acquisition of a response signal D0 depending on the timing of application of a strobe pulse STB (refer to FIG. 5C). As mentioned above, the response time measuring device 120 detects a timing when the IC under test 119 starts to output a response signal D0 by shifting the timing of application of a strobe pulse STB by a predetermined phase in regular sequence for each test cycle throughout the entire time range in which a response signal is present, and measures a response time of the IC under test 119 to determine whether the response of the IC under test 119 is fast or slow.

Therefore, if the dead time DT mentioned above should exist, a response time of the IC under test 119 cannot be measured during the dead time DT, and hence there occurs a problem that a test for determining the operating speed cannot be carried out. Particularly, since the comparator CP cannot correctly acquire a response signal D0 during the dead time DT, whether or not the IC under test 119 correctly operates cannot be determined during the dead time DT.

In case of operating the IC under test 119 at high speed, the read cycle R and the write cycle W shown in FIG. 5A must be repeated at high speed. Accordingly, the existence of the dead time DT results in a big obstacle in materializing a high-speed testing.

In order to overcome this drawback, an IC driving method shown in FIG. 6 has been proposed.

The IC driving method shown in FIG. 6 has two sets of pin electronics circuits provided for one I/O pin of the IC under test 119, which are connected such that a drive signal path or line BL1 is connected between a driver DR1 of the first set of pin electronics circuit and an I/O pin 119A of the IC under test 119 and a response signal path or line BL2 is connected between the I/O pin 119A of the IC under test 119 and an input terminal of a comparator CP2 of the second set of pin electronics circuit. That is, it is constructed that the drive signal line BL1 and the response signal line BL2 are separated from each other, and an application of a drive signal and an acquisition of a response signal are performed through separate lines, respectively. The first set of pin electronics circuit comprises the driver DR1 and a comparator CP1, and the second set of pin electronics circuit comprises a driver DR2 and the comparator CP2.

It is assumed that a propagation delay time of the drive signal line BL1 is Tb and a propagation delay time of the response signal line BL2 is Tc. When the driver DR1 of the first set of pin electronics circuit outputs a test pattern signal PAT in the configuration shown in FIG. 6, this test pattern signal PAT arrives at the I/O pin 119A of the IC under test 119 at the timing that the propagation delay time Tb of the drive signal line BL1 has passed, and then arrives at the input terminal of the comparator CP2 of the second set of pin electronics circuit at the timing that the time duration equal to the sum Tb+Tc of the propagation delay time Tb of the drive signal line BL1 and the propagation delay time Tc of the response signal line BL2 has passed.

Consequently, in order to apply the test pattern signal PAT to the IC under test 119 from the beginning of the write cycle W, as shown in FIG. 7, even if the test pattern signal PAT is outputted at the timing preceding the starting timing of the write cycle W by the time duration equal to the propagation delay time Tb (FIG. 7D), this test pattern signal PAT arrives at the input terminal of the comparator CP2 of the second set of pin electronics circuit at the timing that the time duration of Tb+Tc has passed so that only the response signal D0 (FIG. 7B) can continue to be supplied to the input terminal of the comparator CP2. In other words, in this case, the dead time DT shown in FIG. 5 does not exist. As a result, even if the timing of generating a strobe pulse STB (FIG. 7C) is set throughout the time range that the response signal D0 outputted from the IC under test 119 exists, the comparator CP2 can acquire the response signal D0 at all timings.

As mentioned above, if the IC driving method shown in FIG. 6 is used, any dead time DT does not exist. Accordingly, even if the test cycle T is decreased to perform the test at high speed, the comparator CP2 of the second set of pin electronics circuit can surely acquire the response signal D0 from the IC under test 119, and hence a high-speed testing can be materialized.

As is apparent from the above description, in order to materialize a high-speed IC testing apparatus, the IC driving method shown in FIG. 6 is indispensable. In addition, in order to carry out the test at high speed, it is necessary to shorten the test cycle T, accompanied by the timing of applying the strobe pulse STB and the timing of generating the test pattern signal PAT being strictly controlled within the range of a minute time duration. For this end, it is also necessary to grasp accurate values of the propagation delay time Tb of the drive signal line BL1 and the propagation delay time Tc of the response signal line BL2.

From the structure of the aforementioned IC testing apparatus, the sum Tb+Tc of the propagation delay time Tb of the drive signal line BL1 and the propagation delay time Tc of the response signal line BL2 can easily be measured by utilizing the function of the response time measuring device 120. For example, it is sufficient to output a pulse from the driver DR1 of the first set of pin electronics circuit and to measure the time duration from the time point at which the pulse has been outputted until the pulse arrives at the input of the comparator CP2 of the second set of pin electronics circuit. Accordingly, the sum Tb+Tc of the propagation delay times can be measured by applying the strobe pulse STB to the comparator CP2 with the phase of the strobe pulse STB sequentially shifted in the lagging direction of the phase from the timing at which the pulse has been outputted from the driver DR1 and detecting a timing when an output of the comparator CP2 rises up to the logical H.

In this manner, the sum total Tb+Tc of the propagation delay times can easily be measured by the IC testing apparatus as constructed above. However, it is difficult in the IC testing apparatus as constructed above to measure the propagation delay times Tb and Tc separately from each other.

In order to accurately measure the response time of the IC under test 119, the timing of applying the strobe pulse STB and the timing of generating the test pattern signal PAT must accurately be controlled. From this viewpoint, it is necessary to accurately grasp the values of the propagation delay times Tb and Tc separately.

As one method for solving this problem, the assignee of the present application has proposed an invention entitled "CIRCUIT FOR MEASURING A PROPAGATION DELAY TIME OF A TRANSMISSION PATH" (Japanese Patent Application No. 189859/1994) disclosed in Japanese Patent Application Public Disclosure No. 36037/1996. The propagation delay time measuring circuit disclosed in this Patent Application Public Disclosure No. 36037/1996 adopts a method in which, as shown in FIG. 8, the one I/O pin 119A of an IC under test 119 is grounded, a drive pulse is outputted from the driver DR1 of the first set of pin electronics circuit or from the driver DR2 of the second set of pin electronics circuit, a reflected wave of this drive pulse is detected by the comparator CP1 connected in common with the driver DR1 of the first pin electronics or by the comparator CP2 connected in common with the driver DR2 of the second set of pin electronics circuit, and the respective propagation delay times Tb and Tc of the drive signal line BL1 and the response signal line BL2 are measured.

In the circuit for measuring a propagation delay time of a transmission path in the above patent application, the I/O pin 119A of the IC under test 119 must be grounded. It is impossible to perform this grounding work by manual operation. Next, the reason thereof will be described.

An IC testing apparatus is constructed such that many ICs under test are automatically transported using an IC transporting and handling apparatus called "handler" in this technical field, a plurality of ICs, for example, 8 ICs, 16 ICs, 32 ICs or so are mounted at one time on IC sockets provided on the test head already described, and are tested at the same time.

In the IC testing apparatus constructed as such, it is difficult to ground the I/O pin by handwork only in case of measuring the propagation delay times Tb and Tc. However, as one method that can be taken, there is conceived a method in which dummy ICs in each of which the I/O pin is internally connected to a ground circuit are transported by the handler, and the measurement of the propagation delay times Tb and Tc is carried out in the state that these dummy ICs are mounted on respective IC sockets of the test head.

As shown in FIG. 9, within the test head TH of the IC testing apparatus are accommodated pin cards (pin electronics parts) on each 124 of which circuits and the like including the driver group 116 and the comparator group 117 of the IC testing apparatus TES are formed, as already described, and the performance board 125 is mounted on the top portion of the test head TH. A predetermined number of IC sockets SK are mounted on the upper portion of the performance board 125, and the number of terminals of each of the IC sockets corresponds to the number of pins of the IC under test 119. Usually, the IC sockets SK are secured to the performance board 125, and accordingly, in case of changing the type of ICs to be tested, a performance board having IC sockets corresponding to ICs of new type must be used, which results in that the entire performance board must be replaced by new one.

For this reason, a plurality of performance boards have been added to an IC testing apparatus as accessories, and it is necessary to measure the propagation delay times Tb and Tc for each of the performance boards added to the IC testing apparatus. It is sufficient to carry out the measurement of the propagation delay times Tb and Tc once in the state that the performance board 125 is mounted on the test head TH. However, many drive signal lines BL1, for example, such as 1000 lines or so are formed on the performance board 125, and the same number of response signal lines BL2 are also formed on this performance board 125 (in general, a signal line is called "channel"). Accordingly, there is a drawback that the measurement of the propagation delay times Tb and Tc requires a very long time and much workload, resulting in a very troublesome work.

SUMMARY OF THE INVENTION

It is an object of the present invention to provide an IC testing apparatus which is capable of accurately measuring respective propagation delay times of a drive signal transmission path and a response signal transmission path separately from each other without need for grounding an input/output terminal of an IC under test, and of correctly testing a high-speed IC.

It is another object of the present invention to provide a method of measuring a propagation delay time of a transmission path in an IC testing apparatus, which is capable of accurately measuring respective propagation delay times of a drive signal transmission path and a response signal transmission path in a short time duration and separately from each other without need for mounting an IC under test on an IC socket.

In order to accomplish the aforesaid objects, in one aspect of the present invention, there is provided a propagation delay time measuring method in a semiconductor integrated circuit testing apparatus wherein a test pattern signal is supplied from a driver to an input/output terminal of a semiconductor integrated circuit under test through a first signal transmission path connected between the input/output terminal of the semiconductor integrated circuit under test and the driver, a response signal from the semiconductor integrated circuit under test outputted from the input/output terminal is inputted to a comparator through a second signal transmission path connected between the input/output terminal and the comparator, and whether the response signal outputted from the semiconductor integrated circuit under test coincides with a predetermined expected value or not is tested in a logical comparator means connected to the output side of the comparator, the aforesaid measuring method comprising the steps of: forming the first and the second signal transmission paths such that a length of the first signal transmission path and a length of the second signal transmission path have a ratio of 1:1 as much as possible; supplying a pulse signal from the driver to the first signal transmission path; detecting a timing when the pulse signal is outputted from the second signal transmission path, thereby to measure a propagation delay time caused by the first and the second signal transmission paths when the pulse signal has propagated therethrough; and determining a time duration equal to ½ of the measured propagation delay time to be a propagation delay time of each of the first and the second signal transmission paths.

In a preferred embodiment, the aforesaid step of detecting a timing when the pulse signal is outputted from the second signal transmission path applies strobe pulses the phases of which are sequentially lagged to the comparator connected to the second signal transmission path, and detects the rising timing of the pulse signal inputted to the comparator, and the aforesaid step of measuring a propagation delay time measures the propagation delay time caused by the first and the second signal transmission paths when the pulse signal has propagated therethrough on the basis of the timing at which the pulse signal is supplied from the driver to the first signal transmission path and the rising timing of the pulse signal inputted to the comparator.

According to the aforesaid propagation delay time measuring method, since a propagation delay time of a pulse signal propagating through both the first and the second signal transmission paths is measured, and a time duration equal to ½ of the measured value is determined to be a propagation delay time of each of the first and the second signal transmission paths, it suffices to simply input a pulse signal into either one of the first and the second signal transmission paths, thereby to input the pulse signal into the comparator connected to the other side of the series connected first and second signal transmission paths, and to detect a receiving timing of the pulse signal in the comparator based on the timing of supplying a strobe pulse, without need for grounding an input/output terminal of the semiconductor integrated circuit under test or without need for mounting the semiconductor integrated circuit under test on an IC socket.

In a second aspect of the present invention, there is provided a propagation delay time measuring method in a semiconductor integrated circuit testing apparatus wherein a test pattern signal is supplied from a driver to an input/output terminal of a semiconductor integrated circuit under test through a first signal transmission path connected between the input/output terminal of the semiconductor integrated circuit under test and the driver, a response signal from the semiconductor integrated circuit under test outputted from the input/output terminal is inputted to a comparator through a second signal transmission path connected between the input/output terminal and the comparator, and whether the response signal outputted from the semiconductor integrated circuit under test coincides with a predetermined expected value or not is tested in a logical comparator means connected to the output side of the comparator, the aforesaid measuring method comprising the steps of: forming the first and the second signal transmission paths such that a length of the first signal transmission path and a length of the second signal transmission path have a ratio of 1:1 as much as possible; supplying a pulse signal from the driver to the first signal transmission path; reflecting the pulse signal outputted from the second signal transmission path after having propagated through the first signal transmission path and the second signal transmission path to input the reflected pulse signal into the second signal transmission path; detecting a timing when the pulse signal is outputted from the first signal transmission path after having propagated through the second signal transmission path and the first signal transmission path, thereby to measure a propagation delay time caused by the first and the second signal transmission paths when the pulse signal has propagated therethrough in both ways; and determining a time duration equal to ¼ of the measured propagation delay time to be a propagation delay time of each of the first and the second signal transmission paths.

In a preferred embodiment, the aforesaid step of detecting a timing when the pulse signal is outputted from the first signal transmission path applies strobe pulses the phases of which are sequentially lagged to a comparator connected to the first signal transmission path, and detects the rising timing of the pulse signal inputted to the comparator, and the aforesaid step of measuring a propagation delay time measures the propagation delay time caused by the first and the second signal transmission paths when the pulse signal has propagated therethrough in both ways on the basis of the timing at which the pulse signal is supplied from the driver to the first signal transmission path and the rising timing of the pulse signal inputted to the comparator connected to the first signal transmission path.

In addition, the aforesaid step of reflecting the pulse signal outputted from the second signal transmission path to input the reflected pulse signal into the second signal transmission path includes the step of reflecting the pulse signal at the output end of a driver connected to the second signal transmission path.

In a third aspect of the present invention, there is provided a semiconductor integrated circuit testing apparatus wherein a test pattern signal is supplied from a driver to an input/output terminal of a semiconductor integrated circuit under test through a first signal transmission path connected between the input/output terminal of the semiconductor integrated circuit under test and the driver, a response signal from the semiconductor integrated circuit under test outputted from the input/output terminal is inputted to a comparator through a second signal transmission path connected between the input/output terminal and the comparator, and whether the response signal outputted from the semiconductor integrated circuit under test coincides with a predetermined expected value or not is tested in a logical comparator means connected to the output side of the comparator, the aforesaid testing apparatus comprising: means for forming the first and the second signal transmission paths such that a length of the first signal transmission path and a length of the second signal transmission path have a ratio of 1:1 as much as possible; means for outputting a pulse signal from the driver at a known timing and inputting the pulse signal into the first signal transmission path; means for measuring a propagation delay time given to the pulse signal when the pulse signal has sequentially propagated through the first and the second signal transmission paths; and propagation delay time determining means for determining a time duration equal to ½ of the measured propagation delay time to be a propagation delay time of each of the first and the second signal transmission paths.

In a preferred embodiment, the aforesaid means for measuring a propagation delay time applies strobe pulses the phases of which are sequentially lagged to the comparator connected to the second signal transmission path, thereby to detect the rising timing of the pulse signal inputted to the comparator, and measures the propagation delay time given to the pulse signal when the pulse signal has propagated through the first and the second signal transmission paths on the basis of the detected rising timing of the pulse signal and the known timing of the pulse signal inputted into the first signal transmission path from the driver.

In addition, as the means for measuring a propagation delay time is used response time measuring means for measuring a response time of a semiconductor integrated circuit under test, which is provided in the aforesaid semiconductor integrated circuit testing apparatus.

Moreover, the first and the second signal transmission paths may be formed such that a length of the first signal transmission path and a length of the second signal transmission path have a ratio of 1:1 as much as possible by forming a wiring pattern of the first signal transmission path on a printed board of one layer of a performance board constructed by a multi-layered printed board to be mounted on a test head of the aforesaid semiconductor integrated circuit testing apparatus, copying this wiring pattern on a printed board of an adjacent one layer, thereby to form the wiring pattern of the same shape on the printed board of this adjacent layer, and using these wiring patterns as the first signal transmission path and the second signal transmission path, respectively.

Alternatively, the first and the second signal transmission paths may be formed such that a length of the first signal transmission path and a length of the second signal transmission path have a ratio of 1:1 as much as possible by using cables having the same length as the first signal transmission path and the second signal transmission path, and by connecting between an input/output terminal of the semiconductor integrated circuit under test and the driver, and between the input/output terminal of the semiconductor integrated circuit under test and the comparator by use of the cables, respectively, on a performance board to be mounted on a test head of the aforesaid semiconductor integrated circuit testing apparatus.

In a fourth aspect of the present invention, there is provided a semiconductor integrated circuit testing apparatus wherein a test pattern signal is supplied from a driver to an input/output terminal of a semiconductor integrated circuit under test through a first signal transmission path connected between the input/output terminal of the semiconductor integrated circuit under test and the driver, a response signal from the semiconductor integrated circuit under test outputted from the input/output terminal is inputted to a comparator through a second signal transmission path connected between the input/output terminal and the comparator, and whether the response signal outputted from the semiconductor integrated circuit under test coincides with a predetermined expected value or not is tested in a logical comparator means connected to the output side of the comparator, the aforesaid testing apparatus comprising: means for forming the first and the second signal transmission paths such that a length of the first signal transmission path and a length of the second signal transmission path have a ratio of 1:1 as much as possible; means for outputting a pulse signal from the driver at a known timing and inputting the pulse signal into the first signal transmission path; means for reflecting the pulse signal outputted from the second signal transmission path after having propagated through the first signal transmission path and the second signal transmission path in regular sequence to input the reflected pulse signal into the second signal transmission path; means for measuring a propagation delay time given to the pulse signal when the pulse signal has propagated through the first signal transmission path and the second signal transmission path in both ways; and propagation delay time determining means for determining a time duration equal to ¼ of the measured propagation delay time to be a propagation delay time of each of the first and the second signal transmission paths.

In a preferred embodiment, the aforesaid means for measuring a propagation delay time applies strobe pulses the phases of which are sequentially lagged to a comparator connected to the first signal transmission path, thereby to detect the rising timing of the reflected pulse signal inputted to the comparator after having been outputted from the first signal transmission path, and measures the propagation delay time given to the pulse signal when the pulse signal has propagated through the first and the second signal transmission paths in both ways on the basis of the detected rising timing of the reflected pulse signal and the known timing of the pulse signal inputted into the first signal transmission path from the driver.

In addition, as the aforesaid means for measuring a propagation delay time is used response time measuring means for measuring a response time of a semiconductor integrated circuit under test, which is provided in the aforesaid semiconductor integrated circuit testing apparatus.

The pulse signal outputted from the second signal transmission path is reflected at the output end of a driver connected to the second signal transmission path and is inputted into the second signal transmission path.

Moreover, the first and the second signal transmission paths may be formed such that a length of the first signal transmission path and a length of the second signal transmission path have a ratio of 1:1 as much as possible by forming a wiring pattern of the first signal transmission path on a printed board of one layer of a performance board constructed by a multi-layered printed board to be mounted on a test head of the aforesaid semiconductor integrated circuit testing apparatus, copying this wiring pattern on a printed board of an adjacent one layer, thereby to form the wiring pattern of the same shape on the printed board of this adjacent layer, and using these wiring patterns as the first signal transmission path and the second signal transmission path, respectively.

Alternatively, the first and the second signal transmission paths may be formed such that a length of the first signal transmission path and a length of the second signal transmission path have a ratio of 1:1 as much as possible by using cables having the same length as the first signal transmission path and the second signal transmission path, and by connecting between an input/output terminal of the semiconductor integrated circuit under test and the driver, and between the input/output terminal of the semiconductor integrated circuit under test and the comparator by use of the cables, respectively, on a performance board to be mounted on a test head of the aforesaid semiconductor integrated circuit testing apparatus.

DETAILED DESCRIPTION OF THE PREFERRED EMBODIMENTS

Figure 6:
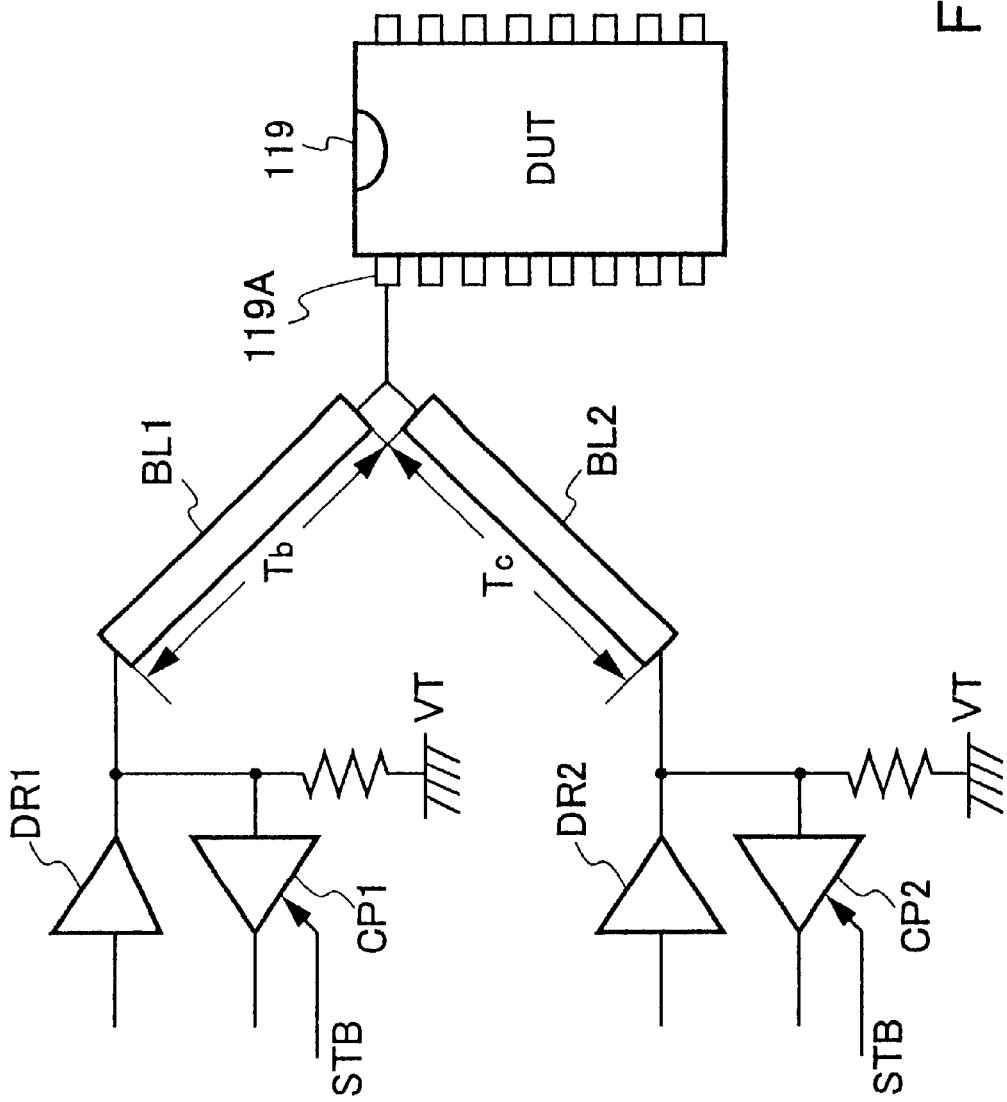
FIG. 6 is a circuit connection diagram showing another example of the pin electronics circuit used in the conventional IC testing apparatus.
Figure 7:
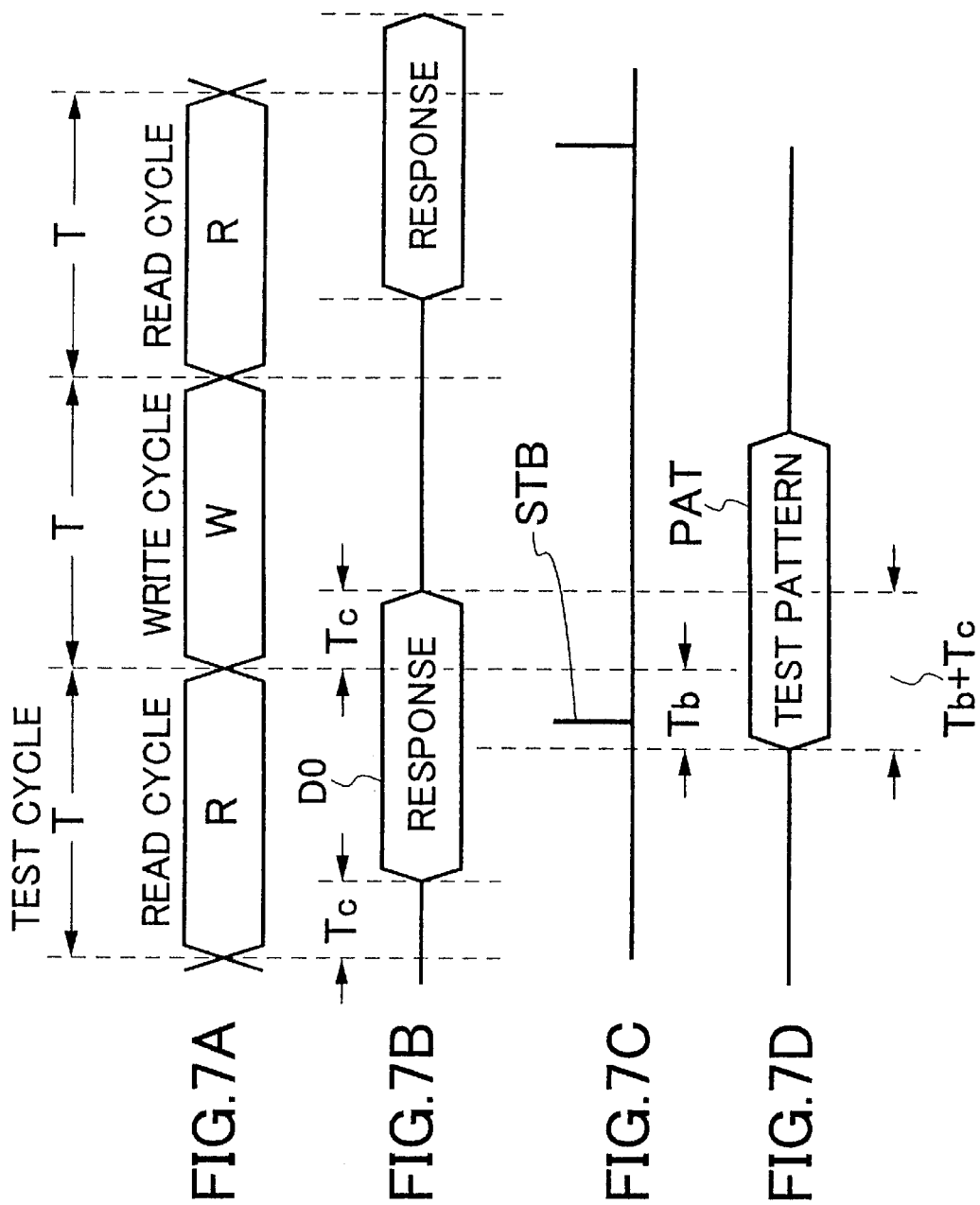
FIG. 7 is a waveform diagram for explaining the operation of the circuit shown in FIG. 6.

Now preferred embodiments of a propagation delay measuring method according to the present invention and an IC testing apparatus using this method will be described in detail with reference to FIGS. 1 and 2. Further, portions and elements in FIGS. 1 and 2 corresponding to those in FIGS. 3 and 6 will be shown by the same reference characters affixed thereto, and the explanation thereof will be omitted unless it is necessary.

Figure 1:
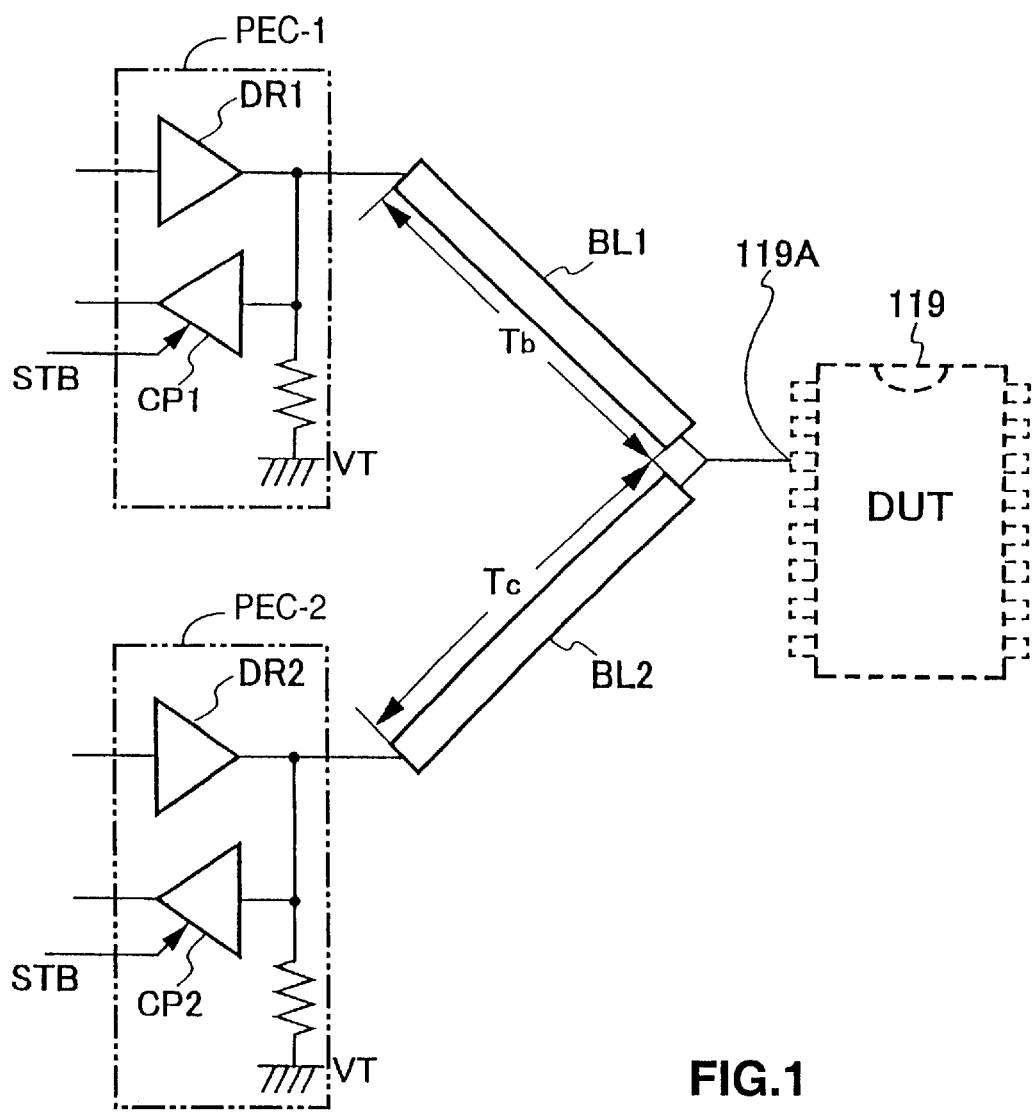
FIG. 1 is a circuit connection diagram showing an example of the pin electronics circuit used in an IC testing apparatus to which a propagation delay time measuring method according to the present invention is applied.

FIG. 1 shows an example of the pin electronics circuit used in an IC testing apparatus to which a propagation delay time measuring method according to the present invention is applied. Similar to the conventional pin electronics circuit shown in FIG. 6, two sets of pin electronics circuits PEC-1, PEC-2 are provided for one I/O pin of an IC under test 119, which are connected such that a drive signal path or line BL1 through which a drive signal is transmitted is connected between a driver DR1 of the first set of pin electronics circuit PEC-1 and an I/O pin of the IC under test 119 and a response signal path or line BL2 through which a response signal outputted from the IC under test 119 is transmitted is connected between the I/O pin and an input terminal of a comparator CP2 of the second set of pin electronics circuit PEC-2. Further, like the case shown in FIG. 6, in this embodiment, the first set of pin electronics circuit PEC-1 comprises the one driver DR1 and one comparator CP1, and the second set of pin electronics circuit PEC-2 comprises one driver DR2 and the one comparator CP2. However, the first set of pin electronics circuit PEC-1 may have only the driver DR1 and the second set of pin electronics circuit PEC-2 may have only the comparator CP2, or the first set of pin electronics circuit PEC-1 may have only the comparator CP1 and the second set of pin electronics circuit PEC-2 may have only the driver DR2.

In the present invention, there is provided a propagation delay time measuring method wherein the drive signal line BL1 and the response signal line BL2 are provided such that line lengths of these signal lines have a ratio of 1:1, i.e., these signal lines have the same length with each other, a pulse signal is supplied from, for example, the driver DR1 of the first set of pin electronics circuit PEC-1 to one end of a signal transmission path composed of the drive signal line BL1 and the response signal line BL2 connected in series, the pulse signal outputted from the other end of the signal transmission path is received by the comparator CP2 of the second set of pin electronics circuit PEC-2, a propagation delay time given to the pulse signal when the pulse signal has propagated through the signal transmission path is measured, and a time duration equal to ½ of the measured value of the propagation delay time is determined to be the propagation delay time of each of the drive signal line BL1 and the response signal line BL2.

Figure 9:
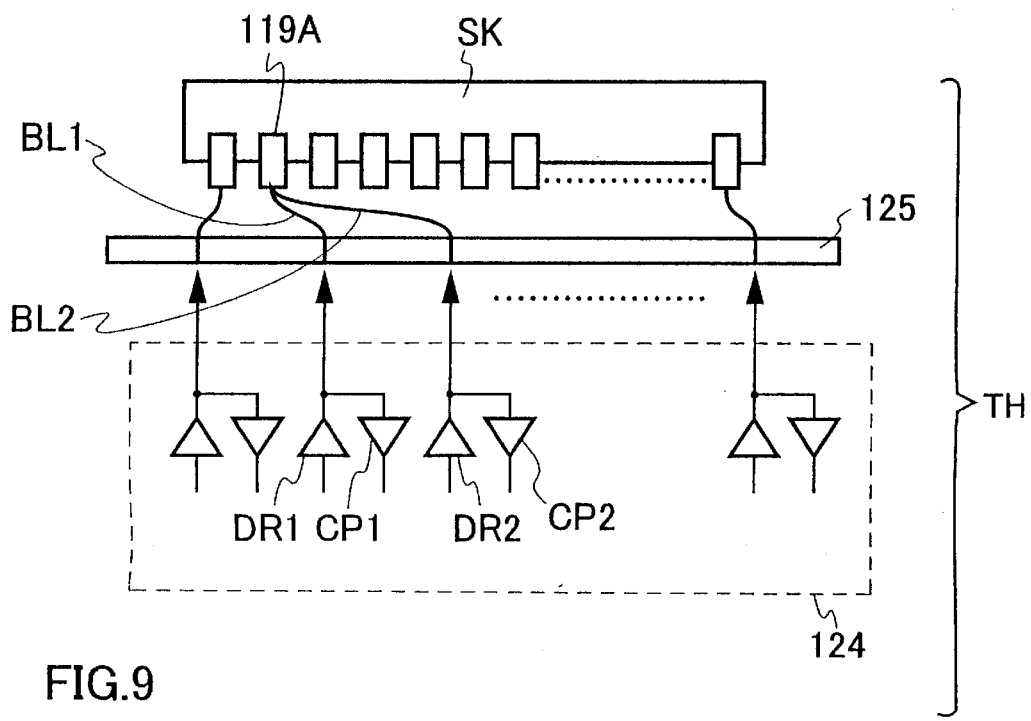
FIG. 9 is a side view for explaining the general structure of a test head of an IC testing apparatus.

In order that the line length of the drive signal line BL1 and the line length of the response signal line BL2 are in the ratio 1:1, these signal lines may be provided as follows, for example. In case of manufacturing the performance board 125 (refer to FIG. 9), the performance board 125 is manufactured by utilizing a plurality of multi-layered printed boards. In such case, a wiring pattern of the drive signal line BL1 is formed on, for example, the printed board of the uppermost layer of the multi-layered printed boards, and this wiring pattern of the drive signal line BL1 is copied on the immediately lower printed board (the second layer from the top) (by a copying operation in software of CAD (computer aided design)), thereby to form the wiring pattern of the same shape on the printed board of the second layer. Then, the wiring pattern on the printed board of the uppermost layer and the wiring pattern on the printed board of the subsequent lower layer may be used as the drive signal line BL1 and the response signal line BL2, respectively. By manufacturing the performance board in such manner, the line length of the drive signal line BL1 and the line length of the response signal line BL2 can be made to have the same length as much as possible.

In this case, it is not necessary that the propagation delay time of a signal transmission path (a drive signal line BL1 and a response signal line BL2) associated with each of the I/O pins of the IC under test 119 maintains a relationship equal to the propagation delay time of a signal transmission path associated with any other one of the I/O pins. For a signal transmission path associated with each I/O pin, the drive signal line BL1 and the response signal line BL2 may be formed such that they have the same line length with each other.

Further, in case that the drive signal line BL1 and the response signal line BL2 are provided by wiring cables on the performance board rather than forming the drive signal line BL1 and the response signal line BL2 as the aforementioned multilayered printed boards, the cable wiling may also be performed such that the line length of the drive signal line BL1 becomes equal to the line length of the response signal line BL2. Of course, the drive signal line BL1 and the response signal line BL2 may be provided such that the line length of the drive signal line BL1 and the line length of the response signal line BL2 can be made to have the same length as much as possible by any other methods.

Figure 2:
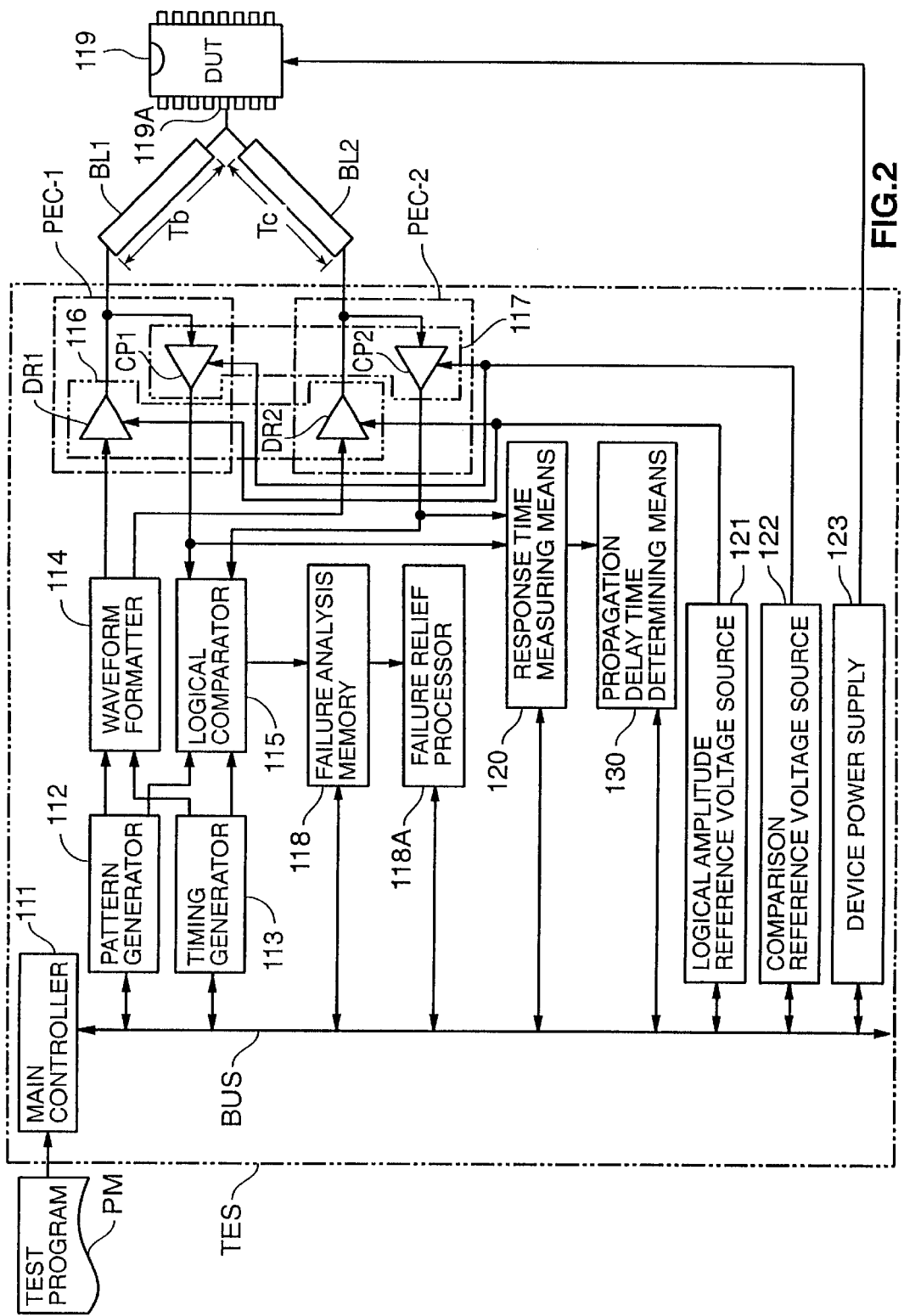
FIG. 2 is a block diagram showing an embodiment of the IC testing apparatus according to the present invention.
Figure 3:
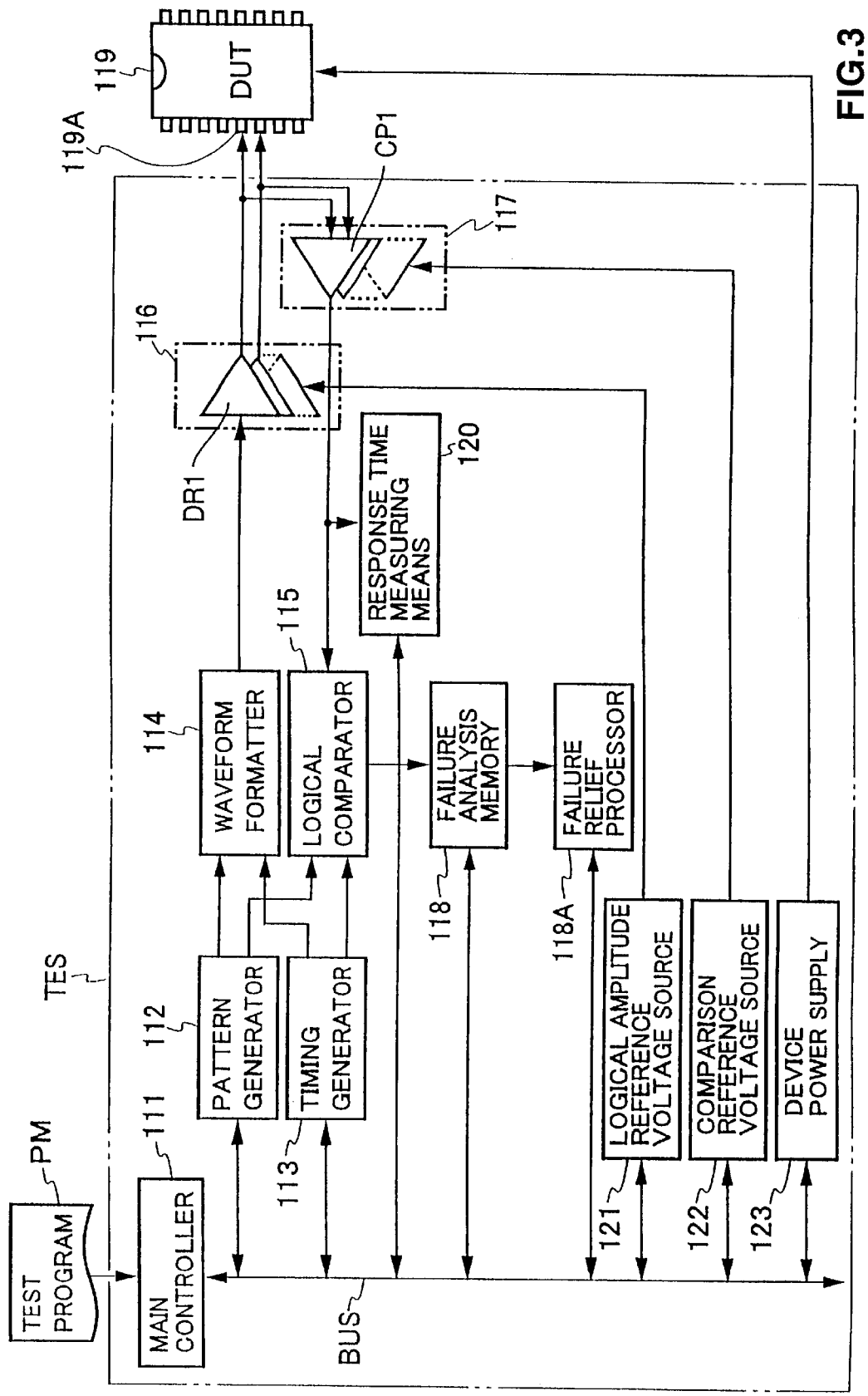
FIG. 3 is a block diagram showing an example of the conventional IC testing apparatus.
Figure 4:
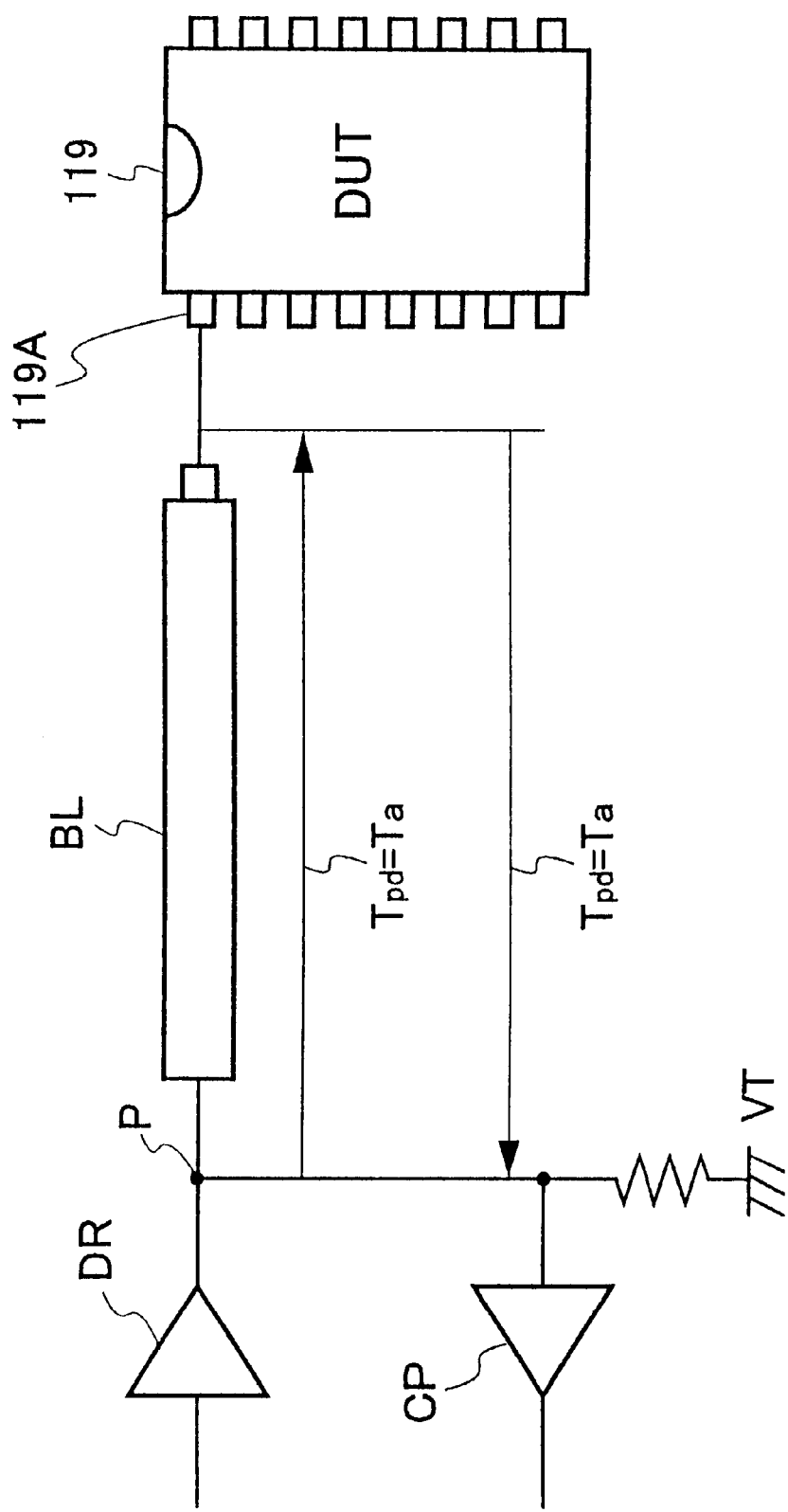
FIG. 4 is a circuit connection diagram showing an example of the pin electronics circuit used in the conventional IC testing apparatus.
Figure 5:
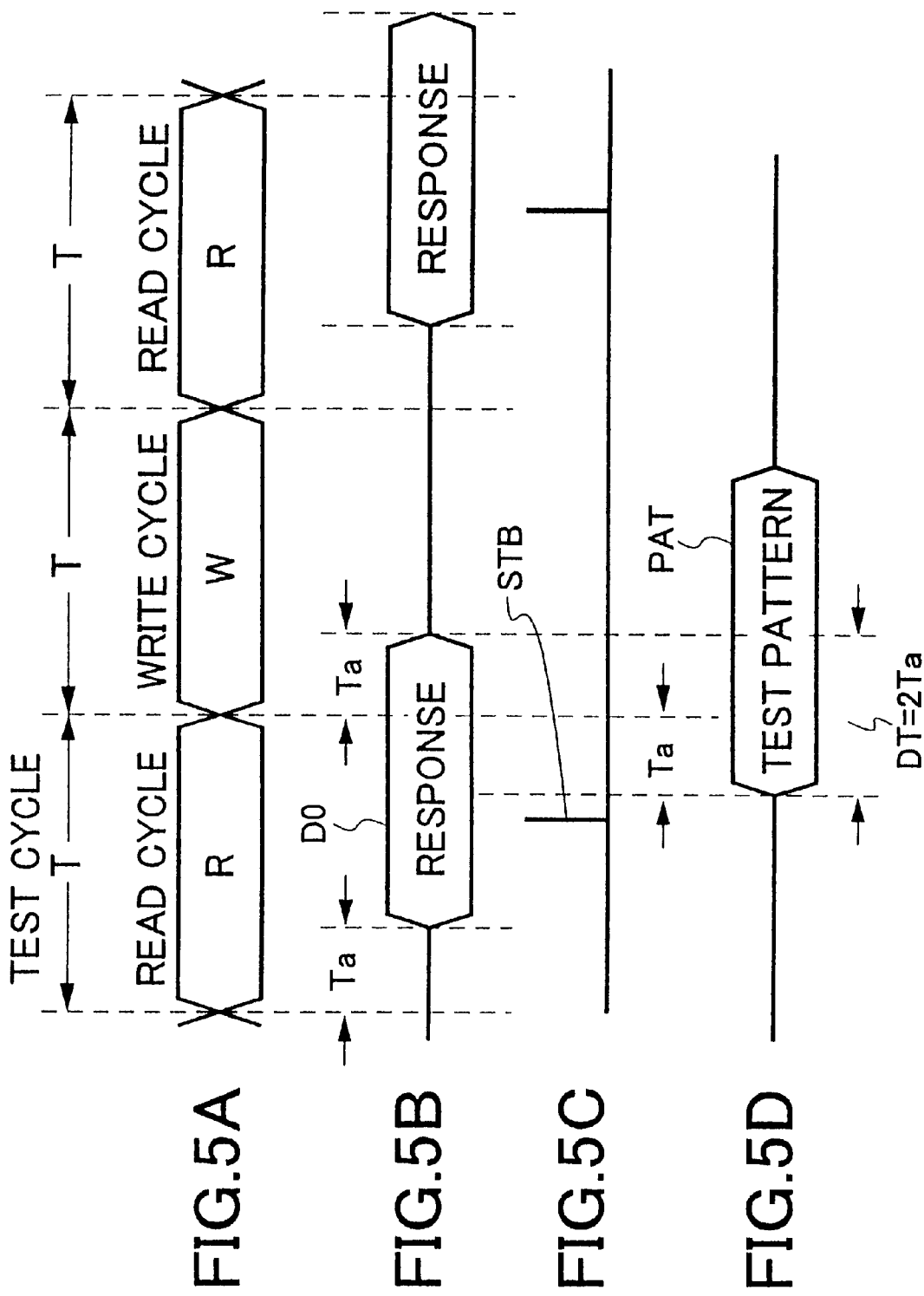
FIG. 5 is a waveform diagram for explaining the operation of the circuit shown in FIG. 4.

FIG. 2 is a block diagram showing an embodiment of the IC testing apparatus according to the present invention to which the aforesaid propagation delay time measuring method according to the present invention is applied. In this embodiment, the IC testing apparatus is constructed such that there is provided a propagation delay time determining device 130 to which an output signal outputted from a response time measuring device 120 is supplied, a propagation delay time of a signal transmission path (the drive signal line BL1 and response signal line BL2 shown in FIG. 1) is measured, before the test of the IC under test, by the response time measuring device 120 to supply the measured value to the propagation delay time determining device 130, in which ½ of the inputted measured value, i.e., ½ of the propagation delay time of the signal transmission path is determined to be the propagation delay time of each of the drive signal line BL1 and the response signal line BL2, and this determined propagation delay time is supplied to the main controller 111.

The measurement of the propagation delay time of the signal transmission path related to each I/O pin is performed by outputting a pulse the generation timing of which is known from a driver of a related pin electronics circuit, for example, a driver DR1 shown in FIG. 1, to supply it to the drive signal line BL1, and a time length when the pulse propagates through the drive signal line BL1 and response signal line BL2 in the sequential order and is inputted to the comparator CP2, i.e., the propagation delay time is measured by the response time measuring device 120. As already mentioned, by supplying the strobe pulses STB by shifting their respective phases in the sequential order from the response time measuring device 120 to the comparator CP2, a rise-up timing of the pulse inputted to the comparator CP2 can be detected. Therefore, from the known generation timing of the propagating pulse and the rise-up timing of the pulse inputted to the comparator CP2, the propagation delay time (Tb+Tc) of the pulse propagating through the drive signal line BL1 and the response signal line BL2 in the sequential order can accurately be measured.

Figure 8:
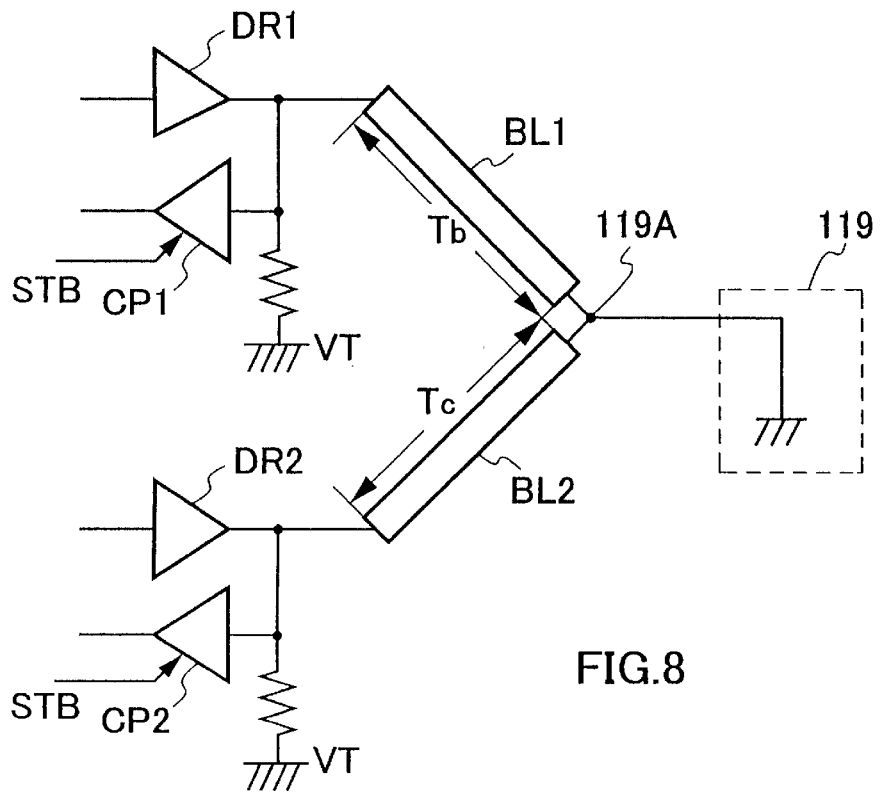
FIG. 8 is a circuit connection diagram showing a further example of the pin electronics circuit used in the conventional IC testing apparatus.

In the aforementioned propagation delay time measuring method according to the present invention, the total propagation delay time (sum of Tb and Tc) of the drive signal line BL1 and the response signal line BL2 can be measured by only inputting a pulse the generation timing of which is known to the drive signal line BL1, and by detecting a rise-up timing of the pulse outputted from the response signal line BL2 after having propagated through the drive signal line BL1 and the response signal line BL2. Therefore, it is not necessary in the measurement of the propagation delay time to ground, as in the prior art shown in FIG. 8, the connection point between the drive signal line BL1 and the response signal line BL2, i.e., the portion of the I/O pin of the IC under test 119. Moreover, since it is not necessary to mount ICs under test 119 on the IC sockets of the test head, the handler does not need to be operated in the measurement of the propagation delay time. As a result, the propagation delay times of the drive signal line BL1 and the response signal line BL2 can be measured with high precision in very short time without performing a very troublesome work.

Furthermore, since the length of the drive signal line BL1 and the length of the response signal line BL2 are equally formed so that the propagation delay time Tb of the drive signal line BL1 and the propagation delay time Tc of the response signal line BL2 are in the relationship of Tb=Tc, the propagation delay time of each of the drive signal line BL1 and the response signal line BL2 can accurately be determined by only dividing the measured propagation delay time by 2.

In the IC testing apparatus according to the present invention shown in FIG. 2, the total propagation delay time of the drive signal line BL1 and the response signal line BL2 can be measured by the response time measuring device 120, and the determination of the propagation delay time of each of the drive signal line BL1 and the response signal line BL2 is performed by the propagation delay time determining device 130. Therefore, it is sufficient to only simply add the propagation delay time determining device 130 to the conventional IC testing apparatus shown in FIG. 3. Therefore, since the propagation delay time of each of the drive signal line BL1 and the response signal line BL2 can be measured by a simple circuit configuration in advance, an IC having I/O pins and operating at high-speed can accurately be tested.

Further, in FIG. 1, the propagation delay time of a pulse may be measured by reflecting the pulse supplied from the driver DR1 of the first set of pin electronics circuit PEC-1 at the output end of the response signal line BL2 (for example, an output terminal of the driver DR2 of the second set of pin electronics circuit PEC-2), and by receiving the reflected wave by the comparator CP1 of the first set of pin electronics circuit PEC-1. In this case, the propagation delay times Tb and Tc of the respective drive signal line BL1 and the response signal line BL2 to be obtained can be determined by dividing the measured propagation delay time by 4.

In addition, in the above embodiment, there is described a case where the propagation delay times of the drive signal line BL1 and the response signal line BL2 that are formed on the performance board, and are related to each I/O pin are measured using delay time measuring functions (the response time measuring device 120 and the propagation delay time determining device 130) provided in the IC testing apparatus.

However, the propagation delay times of the drive signal line and the response signal line that are formed on the performance board, and are related to each I/O pin can also be measured by, for example, a sampling oscilloscope having so-called TDR function comprising a pulse generating function and a function for displaying on a waveform display a state from the pulse generation time through the time when the reflected wave returns.

As is apparent from the above description, according to the present invention, it is not necessary to ground the I/O pins of the IC under test, and it is not necessary to mount the ICs under test on the IC sockets. Therefore, it is not necessary to operate the handler in measuring the propagation delay time. For this reason, there is obtained an advantage that the propagation delay times of the drive signal transmission path and the response signal transmission path can be measured with high precision in very short time without performing a very complicated work.

Moreover, since the length of the drive signal transmission path and the length of the response signal transmission path are equally formed so that the propagation delay times of the drive signal transmission path and the response signal transmission path are equal to each other, the propagation delay time of each of the drive signal transmission path and the response signal transmission path can accurately be determined by only dividing he measured propagation delay time by 2. Particularly, in the case where the total propagation delay time of the drive signal transmission path and the response signal transmission path is measured using the function of the response time measuring device provided in the IC testing apparatus, the propagation delay time of each of the drive signal transmission path and the response signal transmission path can accurately be measured in advance by a simple circuit configuration that only the propagation delay time determining device is simply added. Therefore, an IC having I/O pins and operating at high-speed can accurately be tested, and the effect is very large when the IC testing apparatus according to the present invention is in practical use.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the embodiments shown and described above, and is intended to encompass all such modifications, alterations, changes, and/or minor improvements falling within the scope of the invention defined by the appended claims.

What is claimed is:

1. A propagation delay time measuring method in a semiconductor integrated circuit testing apparatus wherein a test pattern signal is supplied from a driver of a first pin electronics circuit to an input/output terminal of a semiconductor integrated circuit under test through a first signal transmission path connected between said input/output terminal of the semiconductor integrated circuit under test and said driver, a response signal from the semiconductor integrated circuit under test outputted from said input/output terminal is inputted to a comparator of a second pin electronics circuit through a second signal transmission path connected between said one input/output terminal and said comparator, and whether the response signal outputted from said one input/output terminal of the semiconductor integrated circuit under test coincides with a predetermined expected value or not is tested in a logical comparator means connected to an output side of said comparator, said measuring method comprising the steps of:

forming said first and second signal transmission paths to have a substantially the same length;

supplying a pulse signal from said driver to said first signal transmission path;

detecting a timing when the pulse signal is outputted from said second signal transmission path through a series connection of the first and second signal transmission paths to said comparator;

measuring a total propagation delay time of the pulse signal which has propagated through the series connection of said first and second signal transmission paths;

calculating a time duration value equal to ½ of the measured total propagation delay time, and determining the thus calculated time duration value to be a propagation delay time of each of said first and second signal transmission paths.

2. The propagation delay time measuring method as set forth in claim 1, wherein the timing when the pulse signal is outputted from said second signal transmission path is detected by:

applying strobe pulses the phases of which are sequentially lagged to said comparator of the second pin electronics circuit connected to said second signal transmission path; and detecting whether a logical state of an output terminal of the second signal transmission path is inverted or not at a timing of the strobe pulses with the lagged phases; and wherein said total propagation delay time caused by said first and said second signal transmission paths is measured on the basis of the timing at which the pulse signal is supplied from said driver to said first signal transmission path and the rising timing of the pulse signal inputted to said comparator.

3. A propagation delay time measuring method in a semiconductor integrated circuit testing apparatus wherein a test pattern signal is supplied from a first driver of a first pin electronics circuit which comprises the first driver and a first comparator to an input/output terminal of a semiconductor integrated circuit under test through a first signal transmission path connected between said input/output terminal of the semiconductor integrated circuit under test and said first driver, a response signal from the semiconductor integrated circuit under test outputted from said input/output terminal is inputted to a second comparator of a second pin electronics circuit which comprises a second driver and the second comparator through a second signal transmission path connected between said input/output terminal and said second comparator, and whether the response signal outputted from the semiconductor integrated circuit under test coincides with a predetermined expected value or not is tested in a logical comparator means connected to an output side of said first comparator, said measuring method comprising the steps of:

forming said first and said second signal transmission paths to have a substantially the same length;

supplying a pulse signal from said first driver to said first signal transmission path;

reflecting the pulse signal outputted from said second signal transmission path after having propagated through a series connection of said first signal transmission path and said second signal transmission path, thereby to input the reflected pulse signal to said second signal transmission path;

detecting a timing when the reflected pulse signal is outputted from said first signal transmission path after having propagated through the series connection of said second signal transmission path and said first signal transmission path, thereby to measure a total propagation delay time caused by propagation of said pulse signal through said first and said second signal transmission paths in both ways; and calculating a time duration value equal to ¼ of the measured total propagation delay time, and determining the thus calculated time duration value to be a propagation delay time of each of said first and said second signal transmission paths.

4. The propagation delay time measuring method as set forth in claim 3, wherein the timing when the reflected pulse signal is outputted from said first signal transmission path and inputted to the first comparator of the first pin electronics circuit is detected by:

applying strobe pulses the phases of which are sequentially lagged to the first comparator of the first pin electronics circuit connected to said first signal transmission path; and detecting whether a logical state of the reflected pulse signal outputted from the first signal transmission path is inverted or not at a timing of the strobe pulses with the lagged phases; and wherein said total propagation delay time caused by propagation of said pulse signal through said first and said second signal transmission paths in both ways is measured on the basis of the timing at which the pulse signal is supplied from said first driver to said first signal transmission path and the rising timing of the reflected pulse signal inputted to said first comparator of the first pin electronics circuit connected to said first signal transmission path.

5. The propagation delay time measuring method as set forth in claim 3, wherein said pulse signal outputted from said second signal transmission path is reflected at an output end of the second driver of the second pin electronics circuit connected to said second signal transmission path to thereby input the reflected pulse signal into said second signal transmission path.

6. The propagation delay time measuring method as set forth in claim 4, wherein said pulse signal outputted from said second signal transmission path is reflected at an output end of the second driver of the second pin electronics circuit connected to said second signal transmission path to thereby input the reflected pulse signal into said second signal transmission path.

7. A semiconductor integrated circuit testing apparatus wherein a test pattern signal is supplied from a driver of a first pin electronics circuit to an input/output terminal of a semiconductor integrated circuit under test through a first signal transmission path connected between said input/output terminal of the semiconductor integrated circuit under test and said driver, a response signal from the semiconductor integrated circuit under test outputted from said input/output terminal is inputted to a comparator of a second pin electronics circuit through a second signal transmission path connected between said input/output terminal and said comparator, and whether the response signal outputted from the semiconductor integrated circuit under test coincides with a predetermined expected value or not is tested in a logical comparator means connected to an output side of said comparator, said testing apparatus comprising:

said first and second signal transmission paths that are formed to have substantially the same length;

propagation delay time measuring means which comprises means for applying a pulse signal from said driver at a known timing to said first signal transmission path; and means for measuring a total propagation delay time of the pulse signal when the pulse signal has sequentially propagated through said first and said second signal transmission paths; and propagation delay time determining means for calculating a time duration value equal to ½ of the measured total propagation delay time and for determining the thus calculated time duration value to be a propagation delay time of each of said first and said second signal transmission paths.

8. The semiconductor integrated circuit testing apparatus as set forth in claim 7, wherein said means for measuring the total propagation delay time measures the total propagation delay time:

by applying strobe pulses the phases of which are sequentially lagged to said comparator of the second pin electronics circuit connected to said second signal transmission path, thereby to detect the rising timing of the pulse signal inputted to said comparator, and by measuring said total propagation delay time of the pulse signal on the basis of the detected rising timing of the pulse signal and the known timing of the pulse signal inputted into said first signal transmission path from said driver.

9. The semiconductor integrated circuit testing apparatus as set forth in claim 7, wherein as said propagation delay time measuring means is used response time measuring means for measuring a response time of a semiconductor integrated circuit under test, which is provided in said semiconductor integrated circuit testing apparatus.

10. The semiconductor integrated circuit testing apparatus as set forth in claim 7 wherein said first signal transmission path is formed in a shape of a first wiring pattern having a certain length on a printed circuit board of one layer of a performance board constructed by a multi-layered printed circuit board to be mounted on a test head of said semiconductor integrated circuit testing apparatus, and said second signal transmission path is formed in a shape of a second wiring pattern having the same length as that of the first wiring pattern by copying this first wiring pattern on a printed circuit board of an adjacent one layer of the performance board.

11. The semiconductor integrated circuit testing apparatus as set forth in claim 7 wherein said first and second signal transmission paths are formed by using a pair of cables having the same length which are attached to a performance board to be mounted on a test head of said semiconductor integrated circuit testing apparatus, and by connecting one of the pair cables between an input/output terminal of the semiconductor integrated circuit under test and said driver, and connecting the other one of the pair cables between said input/output terminal of the semiconductor integrated circuit under test and said comparator.

12. The semiconductor integrated circuit testing apparatus as set forth in claim 7, wherein there are provided a plurality of pairs of the first and second signal transmission paths in such a manner that each pair is associated to each input/output terminal of the semiconductor integrated circuit under test, and wherein the first and second signal transmission paths in each pair has the substantially the same length.

13. A semiconductor integrated circuit testing apparatus wherein a test pattern signal is supplied from a first driver of a first pin electronics circuit which comprises the first driver and a first comparator to an input/output terminal of a semiconductor integrated circuit under test through a first signal transmission path connected between said input/output terminal of the semiconductor integrated circuit under test and said driver, a response signal from the semiconductor integrated circuit under test outputted from said input/output terminal is inputted to a second comparator of a second pin electronics circuit which comprises a second driver and the second comparator through a second signal transmission path connected between said input/output terminal and said second comparator, and whether the response signal outputted from the semiconductor integrated circuit under test coincides with a predetermined expected value or not is tested in a logical comparator means connected to an output side of said first comparator, said testing apparatus comprising:

said first and second signal transmission paths which are connected to one input/output terminal of the semiconductor integrated circuit under test and formed to have substantially the same length;

propagation delay time measuring means which comprises means for applying a pulse signal from said first driver at a known timing to said first signal transmission path;

means for reflecting the pulse signal outputted from said second signal transmission path after having propagated through a series connection of said first signal transmission path and said second signal transmission path and for inputting the reflected pulse signal to said second signal transmission path; and means for measuring a total propagation delay time of the pulse signal when the pulse signal has propagated through said first signal transmission path and said second signal transmission path in both ways; and propagation delay time determining means which comprises means for calculating a time duration value equal to ¼ of the measured total propagation delay time and means for determining the thus calculated time duration value to be a propagation delay time of each of said first and said second signal transmission paths.

14. The semiconductor integrated circuit testing apparatus as set forth in claim 13, wherein said means for measuring the total propagation delay time measures said total propagation delay time:

by applying strobe pulses the phases of which are sequentially lagged to said first comparator of the first pin electronics circuit connected to said first signal transmission path, thereby to detect the rising timing of the reflected pulse signal inputted to said first comparator of the first pin electronics circuit after having been outputted from said first signal transmission path, and by measuring said total propagation delay time of the pulse signal on the basis of the detected rising timing of the reflected pulse signal and the known timing of the pulse signal inputted into said first signal transmission path from said driver.

15. The semiconductor integrated circuit testing apparatus as set forth in claim 14, wherein said means for reflecting the pulse signal outputted from said second signal transmission path to input the reflected pulse signal into said second signal transmission path reflects the pulse signal at the output end of the second driver connected to said second signal transmission path.

16. The semiconductor integrated circuit testing apparatus as set forth in claim 13, wherein as said propagation delay time measuring means is used response time measuring means for measuring a response time of a semiconductor integrated circuit under test, which is provided in said semiconductor integrated circuit testing apparatus.

17. The semiconductor integrated circuit testing apparatus as set forth in claim 13, wherein said means for reflecting the pulse signal outputted from said second signal transmission path to input the reflected pulse signal into said second signal transmission path reflects the pulse signal at the output end of the second driver connected to said second signal transmission path.

18. The semiconductor integrated circuit testing apparatus as set forth in claim 13 wherein said first signal transmission path is formed in a shape of a first wiring pattern having a certain length on a printed circuit board of one layer of a performance board constructed by a multi-layered printed circuit board to be mounted on a test head of said semiconductor integrated circuit testing apparatus, and said second signal transmission path is formed in a shape of a second wiring pattern having the same length as that of the first wiring pattern by copying this wiring pattern on a printed circuit board of an adjacent one layer of the performance board.

19. The semiconductor integrated circuit testing apparatus according to claim 13 wherein said first and second signal transmission paths are formed by using a pair of cables having the same length which are attached to a performance board to be mounted on a test head of said semiconductor integrated circuit testing apparatus, and by connecting one of the pair cables between an input/output terminal of the semiconductor integrated circuit under test and said first driver, and connecting the other one of the pair cables between said input/output terminal of the semiconductor integrated circuit under test and said second comparator.

* * * * *